US012602100B2

(12) United States Patent
Tanaka et al.

(10) Patent No.: US 12,602,100 B2
(45) Date of Patent: Apr. 14, 2026

(54) ELECTRONIC MODULE WITH COMMUNICATION-LINE CONTROLLED POWER SUPPLY FOR REDUCING DARK CURRENT

(71) Applicant: Hitachi Astemo, Ltd., Hitachinaka (JP)

(72) Inventors: Daisuke Tanaka, Hitachinaka (JP); Hidetatsu Yamamoto, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 232 days.

(21) Appl. No.: 18/286,145

(22) PCT Filed: Feb. 4, 2022

(86) PCT No.: PCT/JP2022/004499
§ 371 (c)(1),
(2) Date: Oct. 9, 2023

(87) PCT Pub. No.: WO2022/244332
PCT Pub. Date: Nov. 24, 2022

(65) Prior Publication Data
US 2024/0184343 A1 Jun. 6, 2024

(30) Foreign Application Priority Data

May 21, 2021 (JP) ................................. 2021-086156

(51) Int. Cl.
*G06F 1/26* (2006.01)
*H02J 7/00* (2006.01)
*H03K 17/56* (2006.01)
(52) U.S. Cl.
CPC .............. *G06F 1/26* (2013.01); *H02J 7/0063* (2013.01); *H03K 17/56* (2013.01)

(58) Field of Classification Search
None
See application file for complete search history.

(56) References Cited

U.S. PATENT DOCUMENTS

2004/0083234 A1* 4/2004 Higuchi .................... G06F 8/36
2004/0186938 A1* 9/2004 Imada ..................... G06F 30/33
701/1
(Continued)

FOREIGN PATENT DOCUMENTS

JP 2009-202822 A 9/2009
JP 2011-235770 A 11/2011
(Continued)

OTHER PUBLICATIONS

Machine Translation of WO2019239876A1, 2019 (Year: 2019).*
(Continued)

*Primary Examiner* — Danny Chan
(74) *Attorney, Agent, or Firm* — Crowell & Moring LLP

(57) ABSTRACT

To achieve an electronic module capable of reducing dark current, which is current flowing when the electronic module is turned off, and contributing to prevention of battery wear of a vehicle or the like. Therefore, the electronic module connected to a first electronic module via a communication line includes: a microcomputer; a power supply IC that supplies power to the microcomputer; a power supply control circuit that supplies power from a battery power supply to the power supply IC; a control line connected to the communication line; and a first switch circuit that connects the control line and the power supply control circuit.

9 Claims, 5 Drawing Sheets

(56)     References Cited

U.S. PATENT DOCUMENTS

2010/0299466 A1 *  11/2010  Asano ............... H04L 12/40039
                                                                710/105
2012/0054526 A1      3/2012  Sugitachi
2018/0057008 A1      3/2018  Utagawa
2019/0050522 A1 *   2/2019  Alvarez .................. G06F 30/15
2022/0317753 A1 *  10/2022  Tokunaga ............. G06F 1/3228

FOREIGN PATENT DOCUMENTS

JP           2012-51422  A      3/2012
JP          2016-172503  A      9/2016
JP           2020-65333  A      4/2020
WO      WO 2019/239876  A     12/2019

OTHER PUBLICATIONS

International Search Report (PCT/ISA/210) issued in PCT Appli-
cation No. PCT/JP2022/004499 dated May 17, 2022 with English
translation (4 pages).
Japanese-language Written Opinion (PCT/ISA/237) issued in PCT
Application No. PCT/JP2022/004499 dated May 17, 2022 with
English translation (10 pages).

* cited by examiner

AUTOMATIC DRIVING SYSTEM

ELECTRONIC MODULE WITH COMMUNICATION-LINE CONTROLLED POWER SUPPLY FOR REDUCING DARK CURRENT

TECHNICAL FIELD

The present invention relates to reduction of dark current in an electronic module.

BACKGROUND ART

An electronic control device (ECU: Electronic Control Unit) that is an electronic module for controlling a vehicle includes, for example, a main ECU that outputs a control command, and a plurality of sub-ECUs that are connected to the main ECU and performs engine control, automatic brake control, display control, and the like based on the control command from the main ECU. In addition, the ECU processes many sensor signals for recognizing the external situation. Therefore, as the number of sensors increases, the number of sub-ECUs to which the sensors are connected and which process the sensor signals or the number of sub-ECUs equipped with the sensors increases.

In general, there is an activation method by an ignition signal as a method of activating an ECU. However, when the number of sub-ECUs increases, a large number of ignition signal lines are required, and thus there is a problem that the number of wires required for the entire vehicle increases.

PTL 1 is cited as a prior art document in the present technical field. PTL 1 describes a method in which an electronic control device includes a power supply IC that monitors a communication state on a communication line, and controls the power supply IC by a communication signal via a communication bus to supply power to a microcomputer to activate an ECU.

CITATION LIST

Patent Literature

PTL 1: JP 2012-51422 A

SUMMARY OF INVENTION

Technical Problem

In the ECU activating method described in PTL 1, even when the ECU is turned off, a current flows through the power supply IC to monitor the communication state on the communication line, and power continues to be supplied to the power supply IC itself. Therefore, in a case of an automatic driving system in which a large number of sub-ECUs need to be connected, the amount of current flowing through the sub-ECU cannot be ignored, which affects the consumption of the battery of the vehicle.

In view of the above problems, an object of the present invention is to achieve an electronic module capable of reducing dark current, which is current flowing when the electronic module is off, and contributing to prevention of battery wear of a vehicle or the like.

Solution to Problem

As an example, the present invention is an electronic module that is connected to a first electronic module via a communication line, including: a microcomputer; a power supply IC that supplies power to the microcomputer; a power supply control circuit that supplies power from a battery power supply to the power supply IC; a control line connected to the communication line; and a first switch circuit that connects the control line and the power supply control circuit.

Advantageous Effects of Invention

According to the present invention, it is possible to provide an electronic module capable of reducing dark current.

DESCRIPTION OF EMBODIMENTS

Hereinafter, embodiments of the present invention will be described with reference to the drawings. Note that the following embodiment will be described by taking an automatic driving system (vehicle control system) to which the present invention is applied as an example.

First Embodiment

Figure 1:
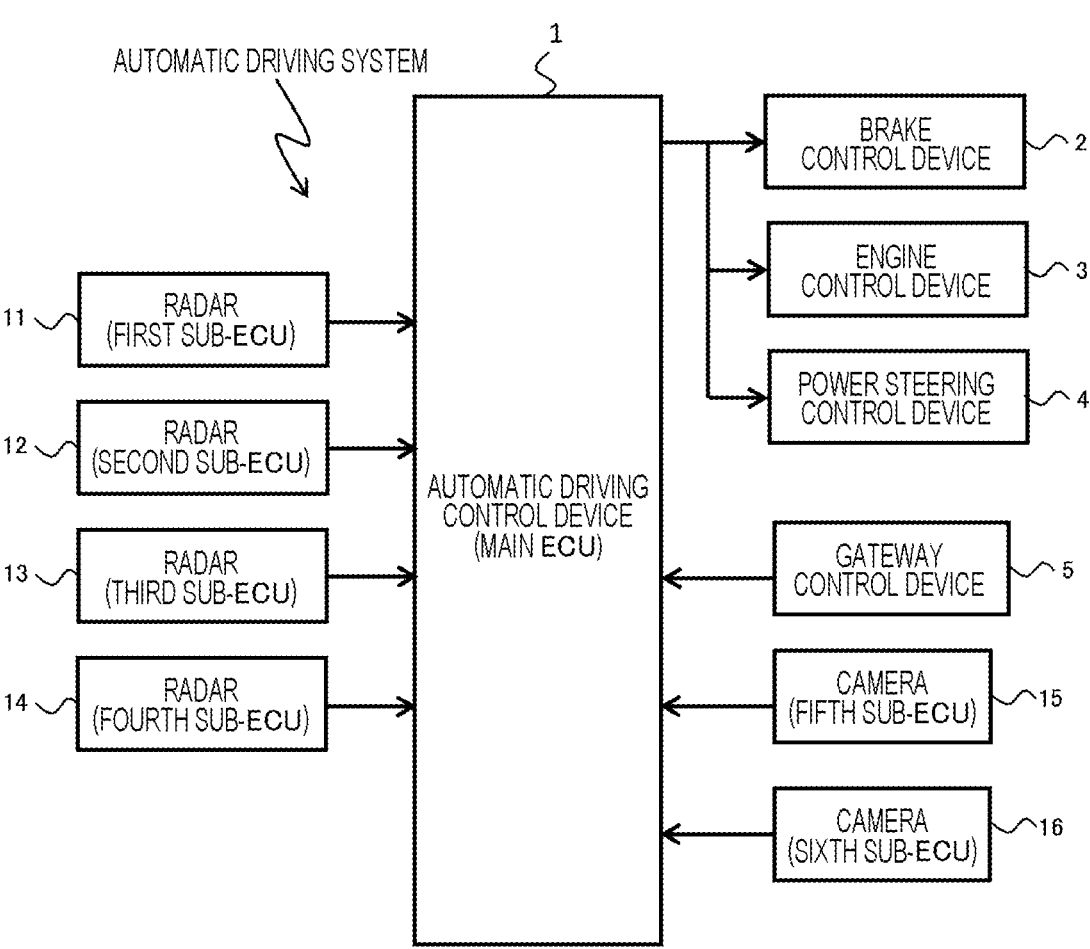
FIG. 1 is a schematic configuration diagram of an automatic driving system according to a first embodiment.

FIG. 1 is a schematic configuration example of an automatic driving system in the present embodiment. In FIG. 1, the automatic driving system includes radars 11, 12, 13, and 14 (first main ECU 11, second sub-ECU 12, third sub-ECU 13, fourth sub-ECU 14) which are external recognition sensors for recognizing the external situation of the vehicle, and cameras 15 and 16 (fifth sub-ECU 15, sixth sub-ECU 16).

The automatic driving system further includes an automatic driving control device 1 (hereinafter, it is referred to as a main ECU 1), a brake control device 2, an engine control device 3, a power steering control device 4, and a gateway control device 5. Further, the brake control device 2, the engine control device 3, and the power steering control device 4 can be collectively called an actuator control device that controls the operation of the vehicle. Each component such as the main ECU 1 and the sub-ECU in FIG. 1 constitutes an electronic module.

The first sub-ECU 11, the second sub-ECU 12, the third sub-ECU 13, the fourth sub-ECU 14, which are radars, and the main ECU 1, the brake control device 2, the engine control device 3, the power steering control device 4, and the gateway control device 5 are connected by an in-vehicle network (for example, a controller area network (CAN), Ethernet (registered trademark), or the like) so as to be able to communicate with each other.

The brake control device 2 is a control device that performs vehicle brake control (braking force control), and the engine control device 3 is a control device that controls an engine that generates a driving force of the vehicle. In addition, the power steering control device 4 is a control device that controls power steering of the vehicle. The gateway control device 5 is a control device that relays communication with other domains other than the automatic driving system.

Here, when receiving the request for automatic driving, the main ECU 1 calculates a trajectory on which the vehicle moves based on external information from the first sub-ECU 11 to the sixth sub-ECU 16. Then, the main ECU 1 outputs control commands such as a brake and a driving force to the brake control device 2, the engine control device 3, and the power steering control device 4 so as to move the vehicle according to the calculated trajectory. The brake control device 2, the engine control device 3, and the power steering control device 4 output an operation signal to each control target (actuator) in response to a control command for automatic driving control from the main ECU 1.

Figure 2:
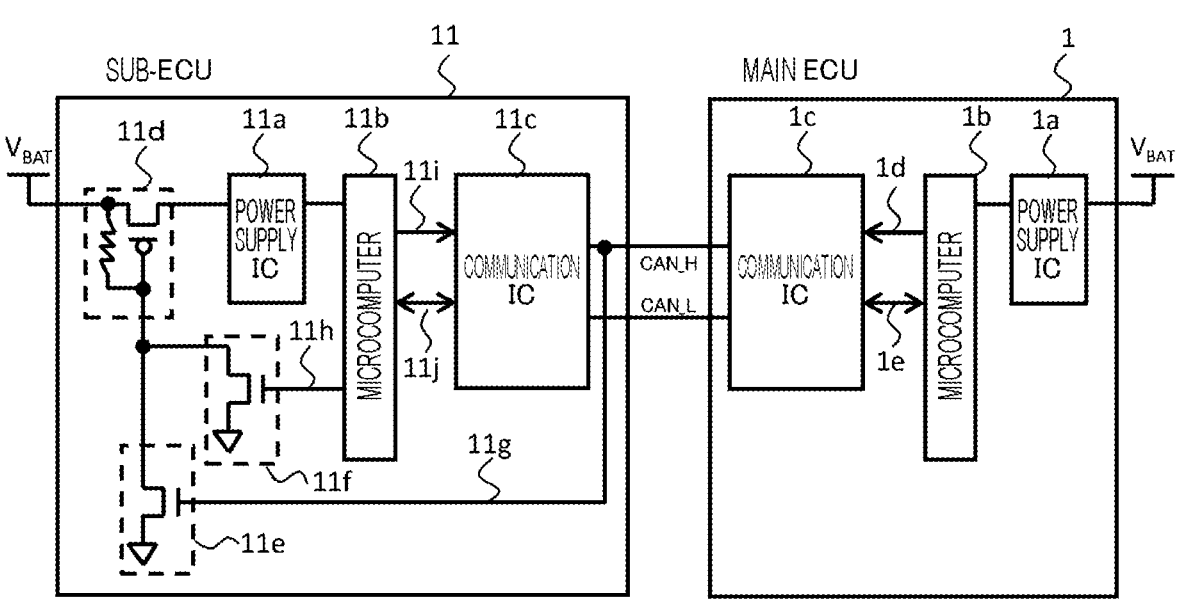
FIG. 2 is a schematic configuration diagram in which a main ECU and a first sub-ECU according to the first embodiment are connected.

FIG. 2 is a schematic configuration diagram in which the main ECU 1 and the radar 11 (hereinafter, referred to as a first sub-ECU 11) in the present embodiment are connected.

In FIG. 2, the main ECU 1 includes a power supply IC 1a, a microcomputer 1b, and a communication IC 1c. The power supply IC 1a supplies a predetermined voltage to the microcomputer 1b, and includes an enable signal line 1d and a transmission/reception communication line 1e between the microcomputer 1b and the communication IC 1c.

The first sub-ECU 11 includes a power supply IC 11a, a microcomputer lib, and a communication IC 11c. The power supply IC 11a supplies a predetermined voltage to the microcomputer 11b. The microcomputer 11b communicates with the microcomputer 1b of the main ECU 1 via the communication ICs 1c and 11c, and transmits external information acquired by the sensor to the microcomputer 1b. Note that the sensor main body is omitted. Communication between main ECU 1 and first sub-ECU 11 is configured as, for example, a CAN bus.

In addition, the first sub-ECU 11 includes a power supply control circuit 11d that supplies power from a battery power supply VBAT to the power supply IC 11a, and includes a first switch circuit 11e and a second switch circuit 11f in order to control the power supply control circuit lid.

A first switch control line 11g draws a communication line from a CAN_H signal line or a CAN_L signal line of the CAN bus, connects to the first switch circuit Ile, and controls the first switch circuit lie by voltage fluctuation of the communication line. The first switch control line 11g is connected from the communication line to the first switch circuit 11e via the high resistance, so that the influence on the communication line can be reduced.

A second switch control line 11h is connected to the microcomputer 11b and controlled by the microcomputer 11b to hold the power supply control circuit 11d in the power supply state even when the first switch circuit 11e is switched on/off by the communication state.

When the first switch control line 11g is connected to the plus side (CAN_H signal) of the communication line, the second switch circuit 11f and the second switch control line 11h may not be provided.

An enable signal line 11i and a transmission/reception communication line 114 are provided between the microcomputer 11b and the communication IC 11c.

Figure 3:
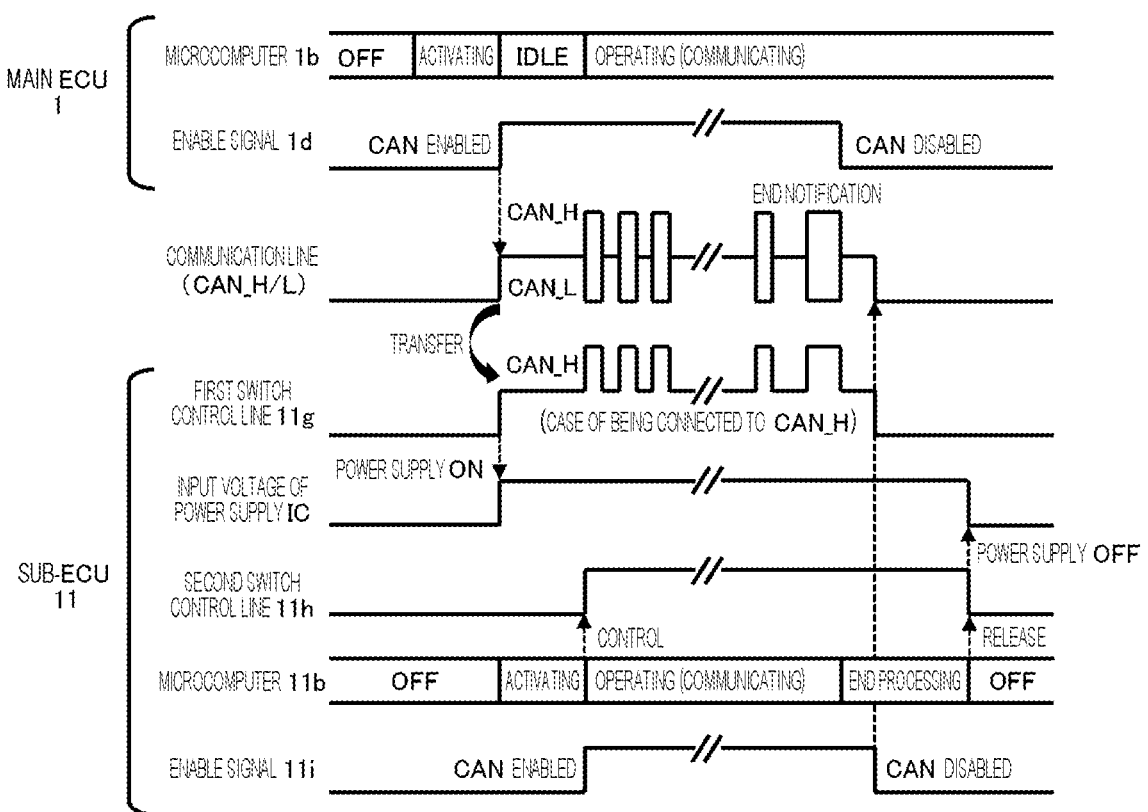
FIG. 3 is a diagram illustrating a power on/power off sequence of the first sub-ECU according to the first embodiment.

FIG. 3 is a diagram illustrating a power on/power off sequence of the first sub-ECU 11 according to the present embodiment.

In FIG. 3, by controlling the enable signal line 1d from the microcomputer 1b of the main ECU 1, the voltage of the CAN_H/L signal which is a communication line increases to a recessive voltage (voltage in a standby state).

The voltage of the first switch control line 11g of the first sub-ECU 11 increases as the voltage of the communication line increases, and when the voltage exceeds a certain threshold voltage, the first switch circuit 11e works to bring the power supply control circuit 11d into the power supply state. When power is supplied, the power supply IC 11a operates, the power supply IC 1a supplies a predetermined voltage to the microcomputer 11b, and the microcomputer lib is activated.

When the microcomputer lib is activated, the second switch control line 11h is controlled to stabilize the power supply of the power supply control circuit lid. Finally, the microcomputer lib controls the enable signal line 11i so as to be able to communicate with the main ECU 1.

In a power off sequence, the microcomputer 1b of the main ECU 1 transmits an end notification to the microcomputer 11b of the first sub-ECU 11 through a communication line, controls the enable signal line 1d, and disables the communication IC 1c.

Upon receiving the end notification, the microcomputer 11b of the first sub-ECU 11 controls the enable signal line 11i and disables the communication IC 11c. Since the communication IC 1c of the main ECU 1 and the communication IC 11c of the first sub-ECU are disabled, the voltage of the communication line decreases and the first switch circuit is disabled.

After the end processing of the microcomputer 11b of the first sub-ECU 11 is performed and the end processing is completed, the second switch control line is controlled to disable the second switch circuit 11f, so that the power supply control circuit 11d enters the power off state.

As described above, according to the present embodiment, the main ECU and the sub-ECU are connected by a communication line such as CAN, and when the main ECU becomes communicable, the communication line enters a standby state and the voltage increases. The sub-ECU draws the communication line as a signal line for controlling the power supply control circuit, and controls the power supply control circuit with the increased voltage to supply power to the sub-ECU. That is, the switch circuit is turned on by the voltage (recessive voltage) in the standby state of the communication line to activate the sub-ECU. Since the power supply IC of the sub-ECU does not need to monitor the communication state on the communication line, there is no need to supply power to the power supply IC when the sub-ECU is turned off, and the sub-ECU can provide a wake-up function capable of reducing the dark current.

Therefore, even in an ECU in an advanced driving assistance system such as automatic driving in which dark current is likely to be generated due to connection of a plurality of sensors, it is possible to dedicate and contribute to prevention of battery exhaustion.

Second Embodiment

Figure 4:
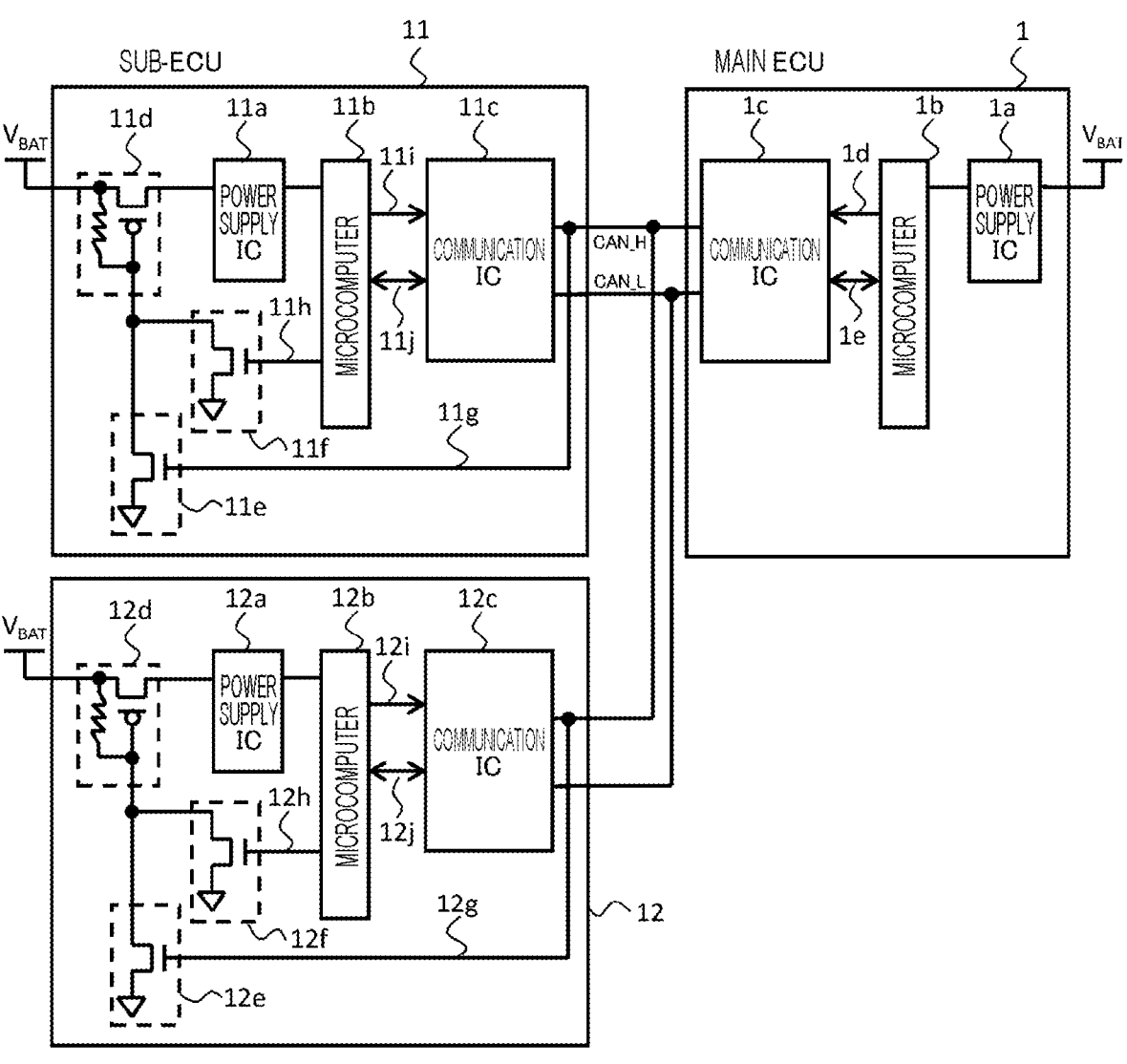
FIG. 4 is a schematic configuration diagram in which a main ECU, a first sub-ECU, and a second sub-ECU are connected in a second embodiment.

FIG. 4 is a schematic configuration diagram in which a first sub-ECU 11 and a radar 12 (hereinafter, referred to as a second sub-ECU 12) are connected to the main ECU 1 according to the present embodiment.

In FIG. 4, similarly to the first sub-ECU 11, the second sub-ECU 12 includes a power supply IC 12a, a microcomputer 12b, and a communication IC 12c, includes a power supply control circuit 12d that supplies power from the battery power supply VBAT to the power supply IC 12a, and includes a first switch circuit 12e and a second switch circuit 12f in order to control the power supply control circuit 12d. Note that the sensor main body is omitted.

The microcomputer 12b is connected to the same CAN bus as the first sub-ECU 11 in order to communicate with the microcomputer 1b of the main ECU 1.

A first switch control line 12g draws a communication line from the CAN_H signal line or the CAN_L signal line of the CAN bus, connects the communication line to the first switch circuit 12e, and performs control by voltage fluctuation of the communication line.

A second switch control line 12h is connected to the microcomputer 12b and controlled by the microcomputer 12b to hold the power supply control circuit 12d in the power supply state even when the first switch circuit 12e is switched on/off by the communication state.

An enable signal line 12i and a transmission/reception communication line 12j are provided between the microcomputer 12b and the communication IC 12c.

When the first switch control line 12g is connected to the plus side (CAN_H signal) of the communication line, the second switch circuit 12f and the second switch control line 12h may not be provided.

The power on/off sequence of the first sub-ECU 11 and the second sub-ECU 12 in the present embodiment is similar to the sequence of the first embodiment illustrated in FIG. 3, and thus the description thereof will be omitted. In the present embodiment, the case where two sub-ECUs are connected to the main ECU has been described, but the same configuration and effect can be obtained even if three or more sub-ECUs are connected.

As described above, according to the present embodiment, even in the case of the main ECU and the plurality of sub-ECUs, the sub-ECU can provide the wake-up function capable of reducing the dark current as in the first embodiment, and can dedicate and contribute to the prevention of battery exhaustion even in the ECU in the advanced driving assistance system such as the automatic driving in which the dark current is likely to be generated by the connection of the plurality of sensors.

Third Embodiment

Figure 5:
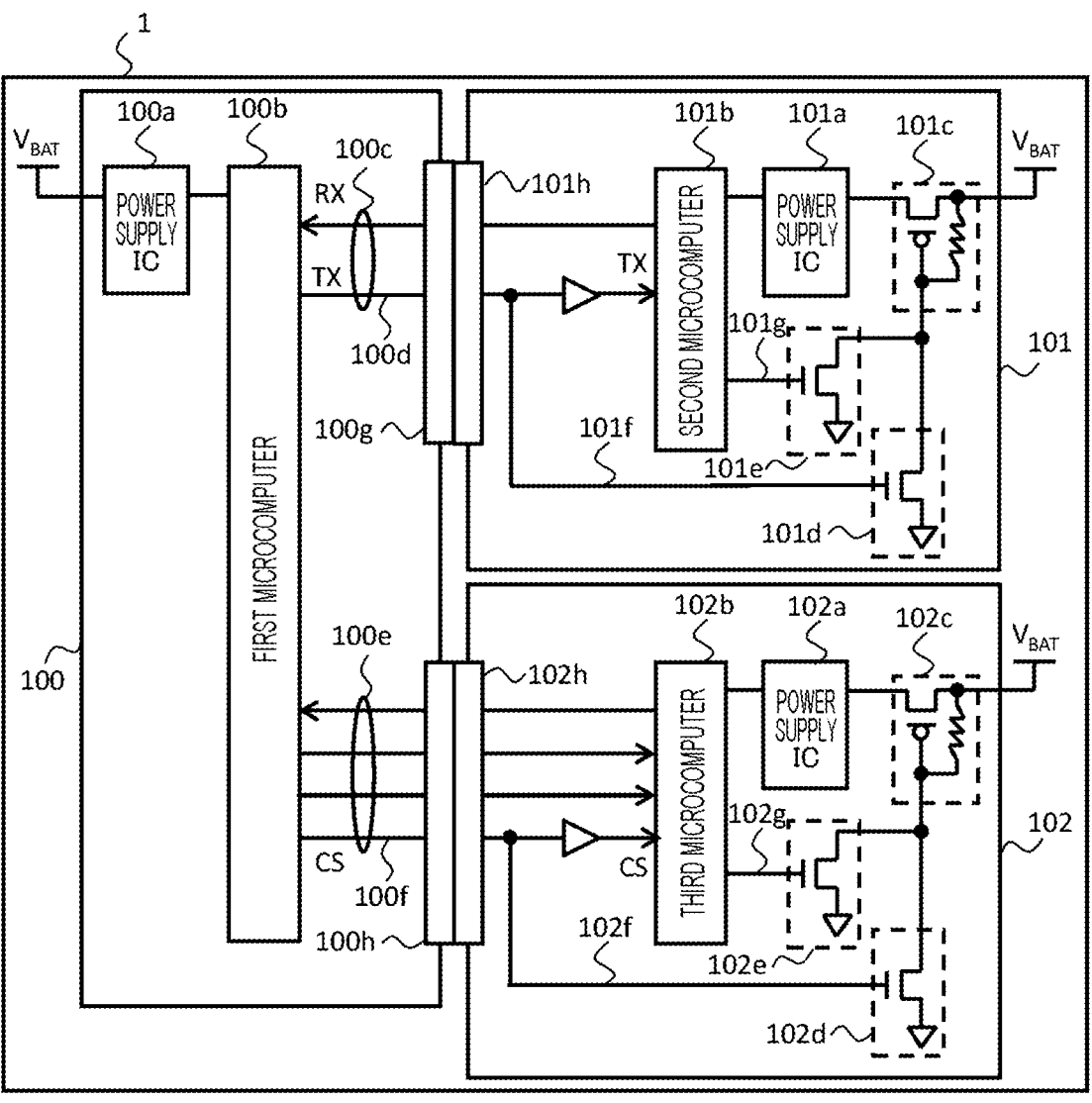
FIG. 5 is a schematic configuration diagram of a main ECU according to a third embodiment.

FIG. 5 is a schematic configuration diagram of the main ECU 1 according to the present embodiment.

In FIG. 5, the main ECU 1 includes a main board 100 and sub-boards 101 and 102. The sub-boards 101 and 102 realize functions of additional options necessary in a scene of automatic driving. Communication between the main board 100 and the sub-board 101 and communication between the main board 100 and the sub-board 102 are configured by, for example, a universal asynchronous receiver/transmitter (UART) or a serial peripheral interface (SPI). The main board 100 and the sub-boards 101 and 102 constitute an electronic module.

In FIG. 5, the main board 100 includes a power supply IC 100a and a first microcomputer 100b, communication with the sub-board 101 is performed by a UART communication line 100c, and communication with the sub-board 102 is performed by an SPI communication line 100e. The sub-board is connected by connectors 100g and 100h.

The sub-board 101 includes a power supply IC 101a and a second microcomputer 101b, includes a power supply control circuit 101c that supplies power from the battery power supply VBAT to the power supply IC 101a, and includes a first switch circuit 101d and a second switch circuit 101e in order to control the power supply control circuit 101c. The main board is connected by a connector 101h.

A first switch control line 101f draws a communication line inside from the TX signal line of the UART, connects to the first switch circuit 101d, and performs control by voltage fluctuation of the communication line.

A second switch control line 101g is connected to the second microcomputer 101b and controlled by the second microcomputer 101b to hold the power supply control circuit 101c in the power supply state even when the first switch circuit 101d is switched on/off due to the communication state.

Similarly to the sub-board 101, the sub-board 102 includes a power supply IC 102a and a third microcomputer 102b, includes a power supply control circuit 102c that supplies power from a battery power supply VBAT to the power supply IC 102a, and includes a first switch circuit 102d and a second switch circuit 102e in order to control the power supply control circuit 102c. The main board is connected by a connector 102h.

A first switch control line 102f draws a communication line from a CS signal line of the SPI, connects the communication line to the first switch circuit 102d, and performs control by voltage fluctuation of the communication line.

A second switch control line 102g is connected to the third microcomputer 102b and controlled by the third microcomputer 102b to hold the power supply control circuit 102c in the power supply state even when the first switch circuit 102d is switched on/off due to the communication state.

Figure 6:
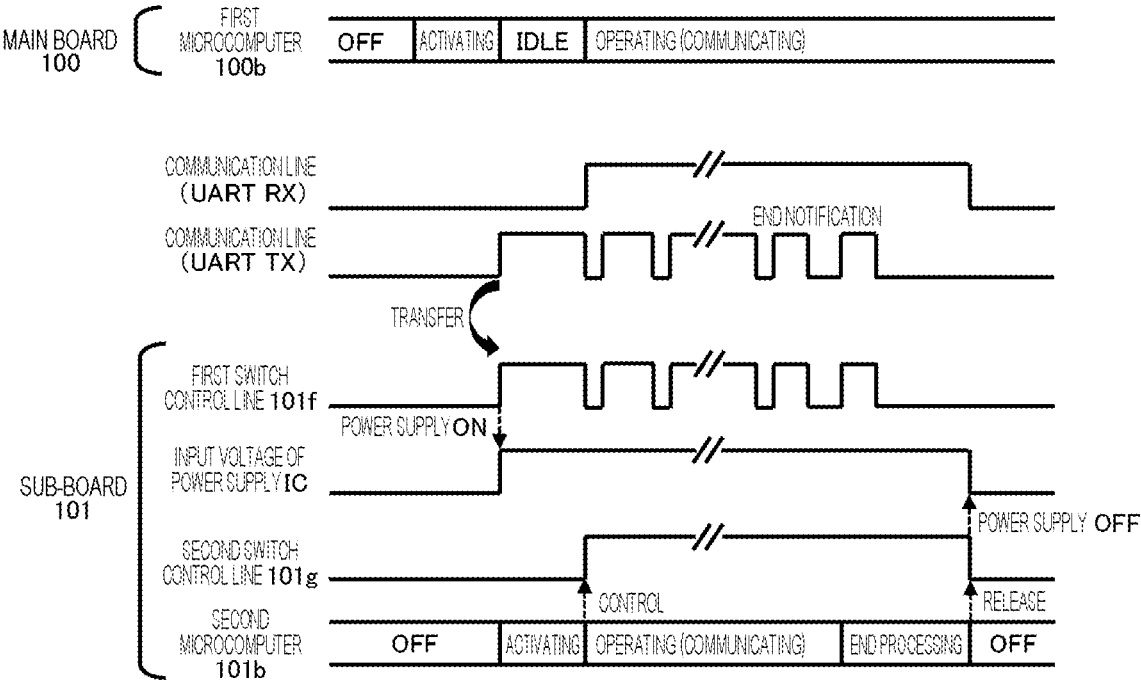
FIG. 6 is a diagram illustrating a power on/power off sequence of the sub-board using UART communication in the third embodiment.

FIG. 6 is a diagram illustrating a power on/power off sequence of the sub-board 101 according to the present embodiment.

In FIG. 6, by bringing the UART communication line 100c of the first microcomputer 100b of the main board 100 into the communicable state, the voltage of a TX signal line 100d increases to the high level. The voltage of the first switch control line 101f of the sub-board 101 increases as the voltage of the communication line increases, and when the voltage exceeds a certain threshold voltage, the first switch circuit 101d works to bring the power supply control circuit 101c into the power supply state. When power is supplied, the power supply IC 101a operates to activate the second microcomputer 101b.

When the second microcomputer 101b is activated, the second switch control line 101g is controlled to stabilize the power supply of the power supply control circuit 101c.

In the power off sequence, the first microcomputer 100b of the main board 100 transmits an end notification to the second microcomputer 101b of the sub-board 101 via a communication line, and the voltage is dropped to the low level of the TX signal line 100d of the UART communication line 100c, thereby disabling the UART communication.

When the TX signal line 100d falls to the Low level, the voltage of the first switch control line 101f decreases, and the first switch circuit 101d becomes disabled.

Upon receiving the end notification, the second microcomputer 10b performs the end processing of the second microcomputer 101b, and after the end processing is completed, the second switch control line 101g is controlled to disable the second switch circuit 101e, so that the power supply control circuit 101c enters the power off state.

By monitoring the voltage of the RX signal line of the UART communication line 100c, the first microcomputer 100b of the main board 100 can confirm that the power supply to the sub-board 101 is cut off.

Figure 7:
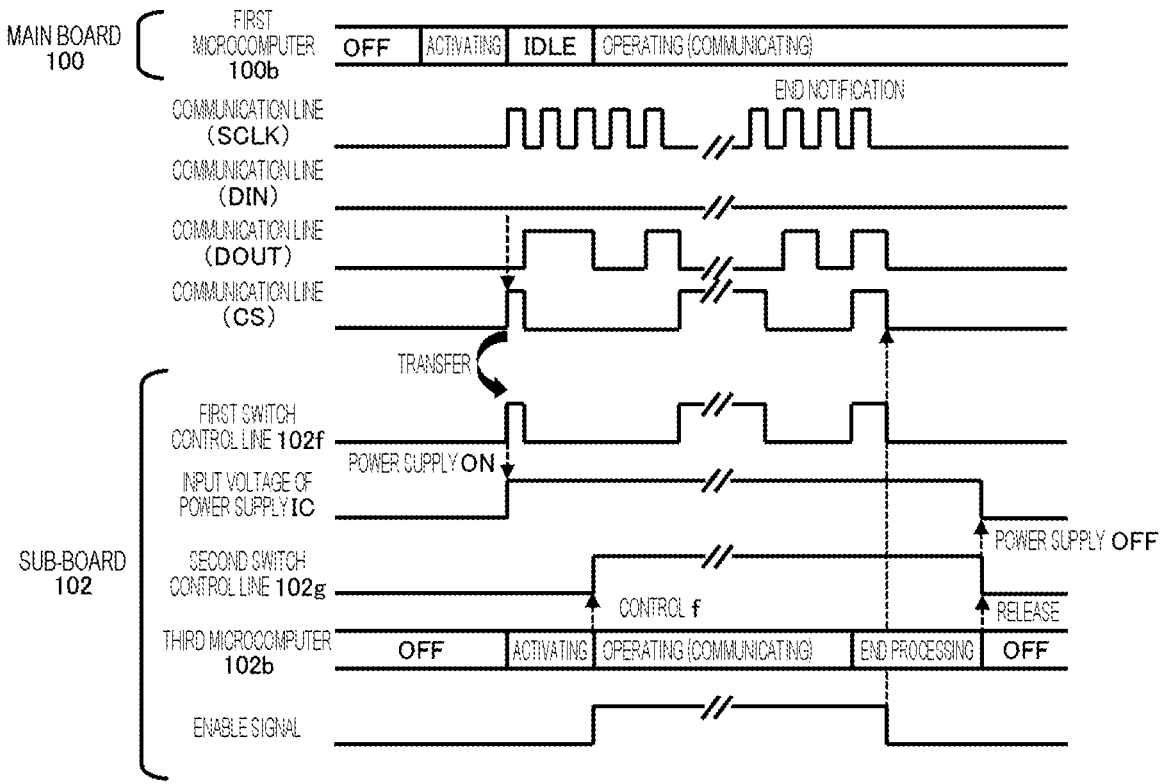
FIG. 7 is a diagram illustrating a power on/power off sequence of the sub-board using SPI communication in the third embodiment.

FIG. 7 is a diagram illustrating a power on/power off sequence of the sub-board 102 according to the present embodiment.

In FIG. 7, by bringing the SPI communication line 100e of the first microcomputer 100b of the main board 100 into the communicable state, the voltage of the CS signal line 100f rises to the High level. The voltage of the first switch control line 102f of the sub-board 102 increases as the voltage of the communication line increases, and when the voltage exceeds a certain threshold voltage, the first switch circuit 102d works to bring the power supply control circuit 102c into the power supply state. When power is supplied, the power supply IC 102a operates to activate the third microcomputer 102b.

When the third microcomputer 102b is activated, the second switch control line 102g is controlled to stabilize the power supply of the power supply control circuit 102c. The third microcomputer 102b controls the enable signal line so as to be communicable with the first microcomputer 100b of the main board 100.

In the power off sequence, the first microcomputer 100b of the main board 100 transmits an end notification to the third microcomputer 102b of the sub-board 102 through a communication line, and the voltage of a CS signal line 100f of the SPI communication line 100e is dropped to the Low level to disable the SPI communication.

When the CS signal line 100f falls to the Low level, the voltage of the first switch control line 102f decreases, and the first switch circuit 102d becomes disabled.

Upon receiving the end notification, the third microcomputer 102b performs the end processing of the third microcomputer 102b, and after the end processing is completed, controls the second switch control line 102g to disable the second switch circuit 102e, so that the power supply control circuit 102c enters the power off state.

The first microcomputer 100b of the main board 100 monitors a DIN signal line by setting the IDLE state of the DIN signal line of the SPI communication line 100e to High (pull-up setting) or the like, so that it can be confirmed that the power supply to the sub-board 102 is cut off.

As described above, according to the present embodiment, since the switch circuit is turned on by the voltage in the standby state of the communication line to activate the sub-board, there is no need to supply power to the power supply IC when the sub-board is turned off, and the sub-board can provide power supply control capable of reducing dark current.

Although the embodiments have been described above, the present invention is not limited to the above-described embodiments and includes various modifications. For example, the present invention is not limited to a vehicle or an automobile, and is applicable to any electronic module connected via a communication line. The above embodiments have been described in detail for easy understanding of the present invention, and the present invention is not necessarily limited to those having all the configurations described. Some of the configurations of a certain embodiment may be replaced with the configurations of the other embodiments, and the configurations of the other embodiments may be added to the configurations of the subject embodiment. It is possible to add, delete, and replace other configurations for a part of the configuration of each embodiment.

REFERENCE SIGNS LIST 1 automatic driving control device (main ECU)
2 brake control device
3 engine control device
4 power steering control device
5 gateway control device
11, 12, 13, 14 radar (first to fourth sub-ECUs)
15, 16 camera (fifth and sixth sub-ECUs)
1a, 11a, 12a power supply IC
1b, 11b, 12b microcomputer
1c, 11c, 12c communication IC
11d, 12d, 101c, 102c power supply control circuit
11e, 12e, 101d, 102d first switch circuit
11f, 12f, 101e, 102e second switch circuit
11g, 12g, 101f, 102f first switch control line
11h, 12h, 101g, 102g second switch control line
1d, 11i, 12i enable signal line
1e, 11j, 12j transmission/reception communication line
100 main board
101, 102 sub-board
100a, 101a, 102a power supply IC
100b first microcomputer
100c UART communication line
100d TX signal line
100e SPI communication line
100f CS signal line
100g, 100h, 101h, 102h connector
101b second microcomputer
102b third microcomputer

The invention claimed is:

1. An electronic module connected to a first electronic module via a communication line, the electronic module comprising:
   a microcomputer;
   a power supply IC that supplies power to the microcomputer;
   a power supply control circuit that supplies power from a battery power supply to the power supply IC;
   a control line connected to the communication line;
   a first switch circuit that connects the control line and the power supply control circuit; and
   a second switch circuit that connects the microcomputer and the power supply control circuit, wherein
      the second switch circuit brings the power supply control circuit into a power supply state when the microcomputer is activated;
   wherein when the communication line reaches an increased voltage, the first switch circuit is switched to ON to turn on the power supply control circuit, and supplies power to the microcomputer, the microcomputer switches the second switch circuit to ON so as to maintain an ON state of the power supply control circuit;
   wherein when the electronic module is to be powered off, the first electronic module transmits an end signal to the microcomputer via the communication line to cause the first electronic module and the electronic module to set the communication line to a disabled state;
   wherein the increased voltage of the communication line is dropped by setting the communication line to a disabled state, and the microcomputer releases an ON state of the power supply control circuit by switching the second switch circuit to OFF;

and wherein the first electronic module is a main unit in a vehicle, and the electronic module is a sub-unit in the vehicle.

2. The electronic module according to claim 1, wherein the first switch circuit switches ON/OFF of the power supply control circuit, and the power supply control circuit is brought into a power supply state by detecting the increased voltage generated in the communication line by activation of the first electronic module by the control line and switching ON of the first switch circuit.

3. The electronic module according to claim 1, wherein the first electronic module is a main ECU, and the electronic module is a sub-ECU.

4. The electronic module according to claim 1, wherein the communication line is a CANH signal line or a CAN_L signal line, and the increased voltage is a recessive voltage.

5. The electronic module according to claim 4, wherein the control line is connected to the first switch circuit from the communication line via a high resistance.

6. The electronic module according to claim 3, wherein a plurality of the sub-ECUs are connected via the communication line, and power supply control is simultaneously performed on the plurality of sub-ECUs.

7. The electronic module according to claim 1, wherein the first electronic module is a main board, the electronic module is a sub-board, the communication line is a communication line of a UART or an SPI transmitted from the main board to the sub-board, and the control line branches off from the communication line in the sub-board and is connected to the first switch circuit of the sub-board, and power supply of the sub-board is controlled.

8. The electronic module according to claim 7, wherein the first switch circuit switches ON/OFF of the power supply control circuit, and the power supply control circuit is brought into a power supply state by detecting the increased voltage generated in the communication line by activation of the main board by the control line and switching ON of the first switch circuit.

9. The electronic module according to claim 8, wherein when the sub-board is powered off, the main board transmits an end signal to the microcomputer via the communication line to cause the main board and the sub-board to set the communication line to a disabled state.

* * * * *